(12) United States Patent
Nishizawa et al.

(10) Patent No.: US 6,791,256 B2
(45) Date of Patent: Sep. 14, 2004

(54) DISPLAY DEVICE HAVING AN IMPROVED ENVELOPE FOR CONTAINING PIXELS THEREIN

(75) Inventors: Masahiro Nishizawa, Mobara (JP); Noriharu Matsudate, Kujukuri (JP); Norikazu Uchiyama, Chikura (JP); Maki Taniguchi, Ichihara (JP)

(73) Assignee: Hitachi, Ltd., Tokyo (JP)

( * ) Notice: Subject to any disclaimer, the term of this patent is extended or adjusted under 35 U.S.C. 154(b) by 40 days.

(21) Appl. No.: 10/361,696

(22) Filed: Feb. 11, 2003

(65) Prior Publication Data

US 2003/0155861 A1 Aug. 21, 2003

(30) Foreign Application Priority Data

Feb. 15, 2002 (JP) ........................................ 2002-038337

(51) Int. Cl.$^7$ ................................................ H01J 17/04
(52) U.S. Cl. ...................................... 313/495; 313/479
(58) Field of Search ................................. 313/638, 478, 313/479, 495; 438/678, 679

(56) References Cited

U.S. PATENT DOCUMENTS 5,811,923 A * 9/1998 Zieba et al. ................. 313/479
6,627,544 B2 * 9/2003 Izumi et al. ................. 438/678

* cited by examiner

Primary Examiner—David Vu
(74) Attorney, Agent, or Firm—Reed Smith LLP; Stanley P. Fisher, Esq.; Juan Carlos A. Marquez, Esq.

(57) ABSTRACT

A display device includes a first substrate, a second substrate disposed to face the first substrate, plural pixels disposed in a display area on an inner surface of the first substrate, a rubber member disposed between the first and second substrates to surround the display area, and sealing the display area from an ambient atmosphere, and an adhesive layer sealing together the first and second substrates along peripheries thereof. The adhesive layer is derived from a sol-gel solution.

19 Claims, 17 Drawing Sheets

FIG. 10
SPECIFICATION OF ADHESIVE

| SOLUTION | MANUFACTURERS | VOLUME % |
|---|---|---|
| SOL-GEL SOLUTION COMPRISED PRINCIPALLY OF SILICON ALKOXIDE | NIPPAN KENKYUJO Co., LTD (TOKYO, JAPAN) | 80 |
| ULTRAFINE POWDER OF SILICON OXIDE (0.07 μm IN AVERAGE DIAMETER) | CATALYSTS & CHEMICAL INDUSTRIES Co., LTD (KAWASAKI, JAPAN) | 20 |

FIG. 12

TEST RESULTS ON GAS PERMEABILITY

| TESTING CONDITIONS | INITIAL VACUUM PRESSURE | VACUUM PRESSURE AFTER TEST |
|---|---|---|
| STORAGE AT 80°C, 85% RH FOR 160 HRS | $6.0 \times 10^{-3}$ Pa | $8.0 \times 10^{-3}$ Pa |
| 12 TEMPERATURE CYCLES OF −40 TO 70°C, 2 HOURS PER CYCLE | $4.0 \times 10^{-3}$ Pa | $5.0 \times 10^{-3}$ Pa |
| STORAGE AT 90°C, 50% RH FOR 160 HRS | $4.0 \times 10^{-3}$ Pa | $4.5 \times 10^{-3}$ Pa |
| IMMERSION IN 10% AMMONIA WATER FOR 24 HRS | $3.0 \times 10^{-3}$ Pa | $4.0 \times 10^{-3}$ Pa |
| IMMERSION IN WATER SOLUTION OF 0.5% NaOH FOR 24 HRS | $4.0 \times 10^{-3}$ Pa | $5.0 \times 10^{-3}$ Pa |
| IMMERSION IN WATER SOLUTION OF 5.0% ACETIC ACID FOR 24 HRS | $4.0 \times 10^{-3}$ Pa | $4.5 \times 10^{-3}$ Pa |

FIG. 14

TEST RESULTS ON AFFINITY

| SUBSTRATE | RUBBER MATERIAL | STRENGTH REQUIRED FOR PEELING OFF (gf) | GAS PERMEABILITY (cc·cm/cm²·sec·atm) |
|---|---|---|---|
| GLASS | SILICONE RUBBER | 200 | 100~400 |
| | URETHANE RUBBER | 60 | 2 |
| | EPICHLOROHYDRIN RUBBER | 50 | 0.3~0.5 |
| ALUMINIUM PLATE | SILICONE RUBBER | 200 | 100~400 |
| | URETHANE RUBBER | 50 | 2 |
| | EPICHLOROHYDRIN RUBBER | 55 | 0.3~0.5 |
| STAINLESS STEEL SHEET (JAPANESE INDUSTRIAL STANDARD SUS304) | SILICONE RUBBER | 70 | 100~400 |
| | URETHANE RUBBER | 50 | 2 |
| | EPICHLOROHYDRIN RUBBER | 50 | 0.3~0.5 |

FIG. 15

EXAMPLES OF SOL-GEL SOLUTION

| COMPOSITION 1 | | COMPOSITION 2 | |
|---|---|---|---|
| SILICONE-ACRYLIC RESIN | 0.1 wt % | SILICONE-ACRYLIC RESIN | 0.05 wt % |
| HYDROLYSATE OF ETHOXY SILANE | 1.5 | HYDROLYSATE OF ETHOXY SILANE | 1.3 |
| ETHYL ALCOHOL | 70 | HYDROLYSATE OF ETHOXY ZIRCONIUM | 0.2 |
| BUTYL ALCOHOL | 28 | BUTYL ALCOHOL | 40 |
| NITRIC ACID | 0.0005 | METHYL ALCOHOL | 58 |
| WATER | BALANCE | POLYETHYLENE GLYCOL (DEGREE OF POLYMERIZATION = 600) | 0.1 |
| | | NITRIC ACID | 0.0005 |
| | | WATER | BALANCE |

FIG. 19

| SPECIFICATIONS | CONVENTIONAL STRUCTURE | SPECIFICATION 1 | SPECIFICATION 2 | SPECIFICATION 3 |
|---|---|---|---|---|
| RUBBER MATERIAL | NONE | SILICONE | URETHANE | EPICHLOROHYDRIN |
| GAS PERMEABILITY (cc·cm/cm²·sec·atm) (≒GAS ABSORPTION SPEED) | NONE | 400 | 2.0 | 0.3 to 0.5 |
| CONCENTRATION OF FREE-OXYGEN ABSORBER (wt %) | NONE | 7.0 ± 2.0 | 10.0 ± 2.0 | 12.0 ± 2.0 |
| CONCENTRATION OF DESICCATING AGENT (wt %) | NONE | 8.0 ± 2.0 | 10.0 ± 2.0 | 13.0 ± 2.0 |
| DESICCATING AGENT PLACED IN SEALED ENVELOPE | NECESSARY | NOT NECESSARY | NOT NECESSARY | NOT NECESSARY |
| SEALING AGENT | NECESSARY | CAN BE OMITTED | CAN BE OMITTED | CAN BE OMITTED |
| GAS ABSORPTION CAPABILITY (COMPARATIVE VALUES) (milliliter) | 100 | 1200 | 810 | 320 |
| TOTAL WEIGHT OF 51 cm-DIAGONAL DISPLAY DEVICE | 480 ± 5g | 486 ± 5g | 487 ± 5g | 487 ± 5g |
| STRENGTH OF CANTILEVER-SUPPORTED DISPLAY DEVICE AGAINST FORCE OF GRAVITY | BROKEN | NOT BROKEN | NOT BROKEN | NOT BROKEN |
| STRENGTH OF DISPLAY DEVICE AGAINST STATIC IN-PLANE FORCE | 400g OR LESS | 1200g OR MORE | 1200g OR MORE | 1200g OR MORE |

DISPLAY DEVICE HAVING AN IMPROVED ENVELOPE FOR CONTAINING PIXELS THEREIN

BACKGROUND OF THE INVENTION

The present invention relates to a display device, and particularly to a display device which seals a display area formed in at least one of two substrates such that the display area is shielded from an ambient atmosphere, and which thereby avoids deterioration of pixel-forming components of the display area, and achieves a long lifetime.

With an arrival of an advanced information society in recent years, a demand for a personal computer, a car navigation system, a portable information terminal, information and telecommunications equipment or a combination thereof is increasing. For a displaying means for these products, a thin, light-weight, low-power display device is suitable, and a liquid crystal display device, or a display device employing a light-emitting type optoelectronic element such as an electroluminescent element or LEDs is used.

The display device employing the light-emitting type optoelectronic element has good readability, wide viewing angles, and is suitable for displaying of moving images because of its fast response, and therefore it is suitable particularly for a video display.

In particular, a display device employing an organic electroluminescent element (also referred to as an organic LED element, hereinafter sometimes abbreviated as an OLED) using recent organic light-emitting material is highly expected for practical use with the rapid improvement of luminous efficacy together with the development of network technology enabling video communication. The OLED has a diode structure having an organic light-emitting layer sandwiched between two electrodes. In general, thin film transistors (hereinafter referred to as TFTs also) are used as switching elements for selecting of pixels in the OLED display device employing the above-explained OLED element.

SUMMARY OF THE INVENTION

A display device including, in addition to the above-described organic EL element, a liquid crystal display device or the like, for example, is generally called a panel-type display device, uses a substrate made preferably of glass as its display screen, and is provided with an image-displaying structure on its inner surface. The rear surface of the substrate is covered with a can (a sealing can) made of glass or metal, and the peripheries of the substrate and the can are sealed together to block gases such as humidity and oxygen of the ambient atmosphere from entering the display device, and thereby to avoid deterioration in characteristics of the image-displaying structure due to humidity, In particular, in the display device employing the organic EL element, it is necessary to block gases such as humidity and oxygen of the ambient atmosphere from entering the display device, and to eliminate gases evolving from various thin film materials which are components of the image-displaying structure included in the display area. To this end, it is necessary to have a structure which seals the display-screen-side substrate and the rear substrate together along their peripheries hermetically to block moisture from entering the sealed envelope and thereby keep the sealed space dry, and adsorbs gases evolving within the sealed space.

The prior art of this kind for keeping the space sealed between the substrates dry is known as disclosed, for example, in Japanese Patent Laid-Open No. Hei 9-148066 laid open on Jun. 6, 1997. In this Publication, a desiccating agent is inserted between a display-screen side glass substrate and a rear substrate (a sealing can). However, a structure sealing the display-screen side glass substrate and the rear substrate is not taken into consideration, and since there is a limit in the moisture absorption capability, it is difficult to continue adsorbing the moisture entering via the sealing structure of both the substrates for a long period of time.

An arrangement is disclosed in Japanese Patent No. 2845239 issued on Jan. 13, 1999 and others, in which adhesives differing in curing conditions depending upon wavelengths and intensities of ultraviolet rays irradiated onto the adhesives are laminated in two (or three) layers, but the influences on elements within the display area such as a display pixel or a liquid crystal material by the adhesives are not taken into consideration. Further, the technology relating to the liquid crystal display device is disclosed in Japanese Patent Laid-Open No. Hei 2-73229 laid open on Mar. 13, 1990 and others, in which an ultraviolet curable sealing material is provided internally of a thermosetting seal, but in this case, either, the influences on the elements within the display area are not taken into consideration.

It is an object of the present invention to provide, paying attention to a fixing structure (a sealing structure) of the display-screen side substrate and the rear substrate, a display device which blocks moisture and gases entering the sealed space via facing portions of peripheries of the two substrates, and reduces deterioration in characteristics caused by gases evolving within the space sealed between the two substrates to obtain a good image display for a long period of time. For simplification of explanation, an explanation will be made hereinafter in which a display-screen-side substrate provided with an image-displaying structure is referred to as a first substrate, and the rear substrate is referred to as a second substrate.

To achieve the aforementioned object, according to the present invention, the first and second substrates are sealed together by disposing an adhesive layer (or an adhesive film) composed chiefly of a material derived from a sol-gel solution between the inner surfaces of the peripheries of the first and second substrates such that the adhesive layer surrounds the image-displaying structure. Further, according to the present invention, along with the adhesive layer composed chiefly of a material derived from a sol-gel solution, a rubber layer having good affinity to the first and second substrates is sandwiched between the first and second substrates such that the rubber layer surrounds the display area.

The above-mentioned first and second substrates are firmly bonded together by the so-called so-gel reaction of a sol-gel solution of ethoxy silane alone or a solution containing alkoxide of metals such as Zr, Ti, Sn or the like, which is interposed between the two substrates. As a rubber (a rubber layer, or a rubber member), a rubber member such as silicone rubber having good elasticity and a good affinity to the substrates is used. In a case where one of the surfaces to be fixed is metal, adhesion is improved by mixing metal particles as fillers with the rubber member. Further, when a rubber member having a good affinity to the substrates is inserted between the two substrates, intimate contact between the two substrates can be obtained with a relatively low pressure applied. When a light-blocking substance such as carbon is mixed into the rubber layer, the light-blocking substances reduces influences on the elements within the display area caused at the time of curing of a photocurable adhesive, or caused by unnecessary light from the outside via the sides or the back.

Further, a known adhesive such as an acrylic system resin or an epoxy system resin may be used as an adhesive, in place of the adhesive layer derived from the sol-gel solution, or together with the adhesive layer derived from the sol-gel solution, in combination with the rubber layer. When the adhesive layer derived from the sol-gel solution or the known adhesives are used, a dehumidifying agent or a free-oxygen absorber or both of them are kneaded to the material of the rubber layer to thereby enable keeping the space between the two substrates in a dried condition. It is noted that the dehumidifying agent or the free-oxygen absorber may be provided between the substrates separately from the rubber.

The typical structures of the present invention will be described as follows:

In accordance with an embodiment of the present invention, there is provided a display device comprising: a first substrate; a second substrate disposed to face said first substrate; a plurality of pixels disposed in a display area on an inner surface of said first substrate; a rubber member disposed between said first and second substrates to surround said display area, and sealing said display area from an ambient atmosphere; and an adhesive layer sealing together said first and second substrates along peripheries thereof, wherein said adhesive layer is derived from a sol-gel solution.

In accordance with another embodiment of the present invention, there is provided a display device comprising: a first substrate; a second substrate disposed to face said first substrate; a plurality of pixels disposed in a display area on an inner surface of said first substrate; a rubber member disposed between said first and second substrates to surround said display area, and sealing said display area from an ambient atmosphere; and an adhesive layer sealing together said first and second substrates along peripheries thereof, wherein said adhesive layer is made of one of a photocurable adhesive and a thermosetting adhesive.

In accordance with another embodiment of the present invention, there is provided a display device comprising: a first substrate; a second substrate disposed to face said first substrate; a plurality of pixels made of an organic light-emitting material and disposed in a display area on an inner surface of said first substrate; a rubber member disposed between said first and second substrates, and having a first part surrounding said display area and a second part superposed on at least a portion of an area on an inner surface of said second substrate, said area directly facing said display area of said first substrate; and an adhesive layer sealing together said first and second substrates along peripheries thereof, wherein said rubber member seals said display area from an ambient atmosphere, and said adhesive layer is derived from a sol-gel solution.

In accordance with another embodiment of the present invention, there is provided a display device comprising: a first substrate; a second substrate disposed to face said first substrate; a plurality of pixels made of an organic light-emitting material and disposed in a display area on an inner surface of said first substrate; a rubber member disposed between said first and second substrates, and having a first part surrounding said display area and a second part superposed on at least a portion of an area on an inner surface of said second substrate, said area directly facing said display area of said first substrate; and an adhesive layer sealing together said first and second substrates along peripheries thereof, wherein said rubber member seals said display area from an ambient atmosphere, and said adhesive layer is made of one of a photocurable adhesive and a thermosetting adhesive.

In accordance with another embodiment of the present invention, there is provided a display device comprising: a first substrate; a second substrate disposed to face said first substrate; a plurality of pixels made of an organic light-emitting material and disposed in a display area on an inner surface of said first substrate; a rubber member disposed between said first and second substrates to surround said display area, and sealing said display area from an ambient atmosphere; and an adhesive layer sealing together said first and second substrates along peripheries thereof, wherein said adhesive layer is derived from a sol-gel solution, and a width of said adhesive layer is in a range of from $1 \times 10^3$ to $1 \times 10^4$ times a thickness of said adhesive layer.

In accordance with another embodiment of the present invention, there is provided a display device comprising: a first substrate; a second substrate disposed to face said first substrate; a plurality of pixels made of an organic light-emitting material and disposed in a display area on an inner surface of said first substrate; and an adhesive layer sealing together said first and second substrates along peripheries thereof from an ambient atmosphere, wherein said adhesive layer is derived from a sol-gel solution, and a width of said adhesive layer is in a range of from $1 \times 10^3$ to $1 \times 10^4$ times a thickness of said adhesive layer.

By the provision of the above-described structures, it is possible to provide a display device which blocks moisture and gases entering the sealed space via facing portions of peripheries between the first and second substrates, reduces deterioration in characteristics caused by gases evolving within the space sealed between the two substrates, improves the strength, and enables to provide a good image display for a long period of time, leading to high reliability and a long lifetime.

The present invention is not limited to the above-described structures and the structures of the embodiments described later, but needless to say, various changes can be made without departing from the technical idea of the present invention. Other objects and structures of the present invention will become apparent from the description of the embodiments described later.

BRIEF DESCRIPTION OF THE DRAWINGS

In the accompanying drawings, in which like reference numerals designate similar components throughout the figures, and in which:

FIG. 10 is a table for explaining a specification example of an adhesive-layer forming solution used in a sample panel for verifying the effect of the present invention;

FIG. 12 is a table for explaining the test results of a gas permeability test of the sample panel in the experimental device of FIG. 11;

FIG. 14 is a table showing the results of an affinity test by the affinity evaluation device of FIG. 13;

FIG. 15 is a table for explaining examples of a composition of a sol-gel solution used where a rubber member is not present;

FIG. 19 is a table showing a comparison of sealing characteritics between embodiments of a display device according to the present invention using a rubber sheet and a conventional display device;

DETAILED DESCRIPTION OF THE PREFERRED EMBODIMENTS

The embodiments of the present invention will be described hereinafter with reference to the drawings of the embodiments. While the present invention can be applied to all the panel type display devices having a structure of attaching two substrates together, a description will be herein made of a display device, as an example, using an organic electoluminescent element.

Figure 20:
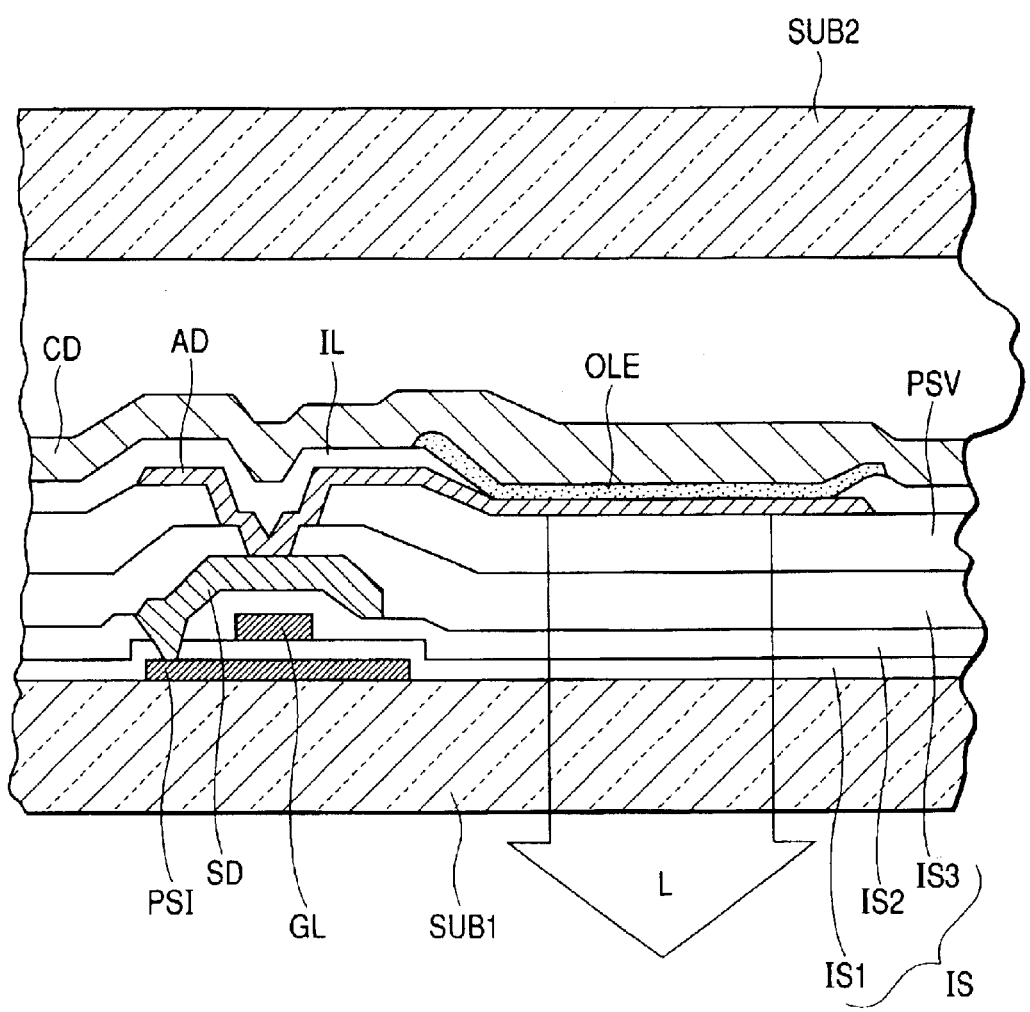
FIG. 20 is a sectional view for explaining a structure in the vicinity of one pixel formed in a display area of a display device using an organic light-emitting element.

FIG. 20 is a sectional view for explaining a structure in the vicinity of one pixel formed in a display area of a display device using an organic light-emitting element. In this display device, an image display structure is formed on an inner surface of a first substrate (in this case, a glass substrate) SUB1. The image display structure is formed by laminating a semiconductor layer PSI for which a low temperature polysilicon is suitable, a first insulating layer IS1, a gate line (gate electrode) which is a scanning line, a second insulating layer IS2, a source electrode SD formed from an aluminum line, a third insulating layer IS3, a protective film PSV, a first electrode layer AD, an interlayer insulating layer IL, an organic light-emitting layer OLE, and a second electrode layer CD. Various thin film structures constituting the display area are also called a display area constituting material.

When a thin film transistor TFT (this thin film transistor is a drive transistor) formed by the silicon semiconductor layer PSI, the gate line GL and the source electrode SD is selected, the organic light-emitting element formed by the first electrode layer AD connected to the source electrode SD, the organic light-emitting layer OLE and the second electrode layer CD emits light, so that light L exits from the first substrate SUB1 to the outside.

The rear surface of the first substrate SUB1 on its side formed with the image-displaying structure is sealed with the second substrate SUB2, and an inert gas such as nitrogen gas is filled in the space between the sealed substrates SUB1, SUB2. In this example, the second substrate SUB2 is made of a glass plate, but a metal can may be used as the second substrate SUB2. The two substrates SUB1, SUB2 are hermetically sealed along their peripheral edges (not shown), irrespective of substrate materials.

Figure 21:
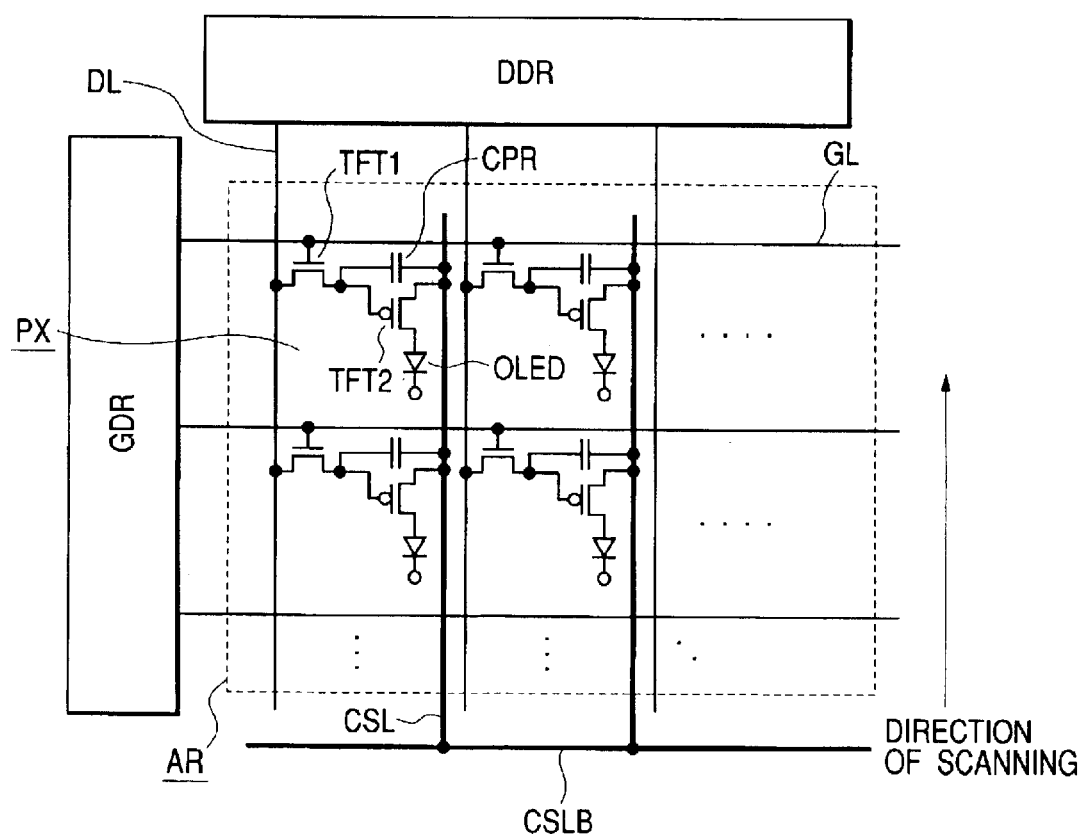
FIG. 21 is a block diagram for schematically explaining one example of an equivalent circuit of a display device using an organic light-emitting element.

FIG. 21 is a block diagram for schematically explaining an example of an equivalent circuit of a display device employing an organic light-emitting element. In FIG. 21, reference character AR denotes a display area, GDR is a gate drive circuit (a scanning drive circuit), DDR is a drain drive circuit (a video signal drive circuit), GL is a gate line (a scanning line), DL is a drain line (a data line). Thin film transistor TFT1 functions as a switching transistor, and thin film transistor TFT2 functions as a drive transistor. Reference character OLED denotes an organic light-emitting element, CPR is a capacitor (a storage capacitance), CSL is a current-supply line, and CSLB is a current-supply bus.

The first thin film transistor TFT1 which serves as a switching transistor selects a pixel, and the second thin film transistor TFT2 which serves as a drive transistor drives the organic light-emitting element OLED. One pixel PX is formed in an area surrounded by the data lines DL, the scanning lines GL, and the current-supply lines CSL. In FIG. 21, now focus attention on the pixel PX among plural pixels selected by one of the plural scanning lines GL. A gate of the first thin film transistor TFT1 is connected to the scanning line GL, its drain is connected to the data line DL, and its source is connected to a gate of the second thin film transistor TFT2.

A drain of the second thin film transistor TFT2 is connected to the current-supply line CSL supplied with a current from the current-supply bus CSLB. A source of the second thin film transistor TFT2 is connected to a first electrode layer (anode) AD of the OLED (see FIG. 20). One terminal of the capacitor CPR which acts as a data signal storage capacitance is connected to a connection point between the source of the first thin film transistor TFT1 and the gate of the second thin film transistor TFT2, and the other terminal is connected to the current-supply line CSL.

In the circuit configuration of the pixel PX, a positive terminal of the capacitor CPR is connected to the connection point of the source of the first thin film transistor TFT1 and the gate of the second thin film transistor TFT2, and its negative terminal is connected to the current-supply line CSL.

Further, the organic light-emitting element OLED is configured such that its organic light-emitting layer OLE is sandwiched between the first electrode layer AD and the second electrode layer (cathode) CD as shown in FIG. 20. The first electrode layer AD is connected to the source electrode of the second thin film transistor TFT2, and the second electrode layer CD is formed solid all over all the pixels.

A data signal (a video signal) from the data line DL is written into the capacitor CPR when the first thin film transistor TFT1 is turned on. Then, when the first thin film transistor TFT1 is turned off, the second thin film transistor TFT2 is turned on, and the amount of a current flowing into the organic light-emitting element OLED from the current-supply line CSL is controlled by the charge (which represents a gray scale level corresponding to the data signal) stored in the capacitor CPR.

The organic light-emitting element OLED generates light of luminance approximately proportional to the supplied current and of a color determined by a material of its organic light-emitting layer OLE.

In the case of a color display, usually, different organic light-emitting layer materials are chosen for red, green and blue pixels, respectively, or combinations of respective color filters and an organic white-light-emitting layer material are used.

Data signals can be supplied in analog form, or in time-division-multiplexed digital form. Gray scale representation can be performed by using an area-modulating gray scale control method which subdivides an area of each of the red, green and blue pixels into plural sub-pixels, and varies the number of the sub-pixels to be turned on, correspondingly to the gray scale level to be displayed, in combination with modulating of luminance of each of the pixels.

When one pixel PX is selected by a signal from the scanning line GL and the thin film transistor TFT1 is turned on, a video signal supplied from the data line DL is stored in the capacitor CPR, and then, when the thin film transistor TFT2 is turned on at the time when the thin film transistor TFT1 is turned off, a current from the current-supply line CSL flows into the organic light-emitting element OLED, and the current continues to flow during approximately one frame period (or one field period). The current flowing at this time is determined by the signal charge stored in the capacitor CPR. The operating level of the thin film transistor TFT2 is determined by a potential of the current-supply line CSL, and thereby light emission from the pixel is controlled.

Further, since the second electrode layer CD of the light-emitting element OLED is the top layer of the light-emitting element, it possibly corrode due to direct contact with the ambient atmosphere. Usually, since the second electrode layer CD is provided to all the pixels in common, and is made solid all over, it is necessary for its connection to an external circuit to electrically connect the second electrode layer CD to an underlying wiring line (sometimes called a second-electrode-layer-connecting electrode layer, or a current extracting electrode). A terminal for supplying a current to the second electrode layer CD is an extension of the second electrode layer CD, and is brought out directly to the terminal portion (terminal pad) of the substrate, and therefore corrosion is easily caused due to moisture or evolving of gases in the vicinity of the terminal portion.

Therefore, the first and second substrates SUB1, SUB2 are sealed together, with the second substrate SUB2 covering the first substrate SUB1 such that the constituent components in the display area are shielded from the ambient atmosphere. However, even within the sealed inside space, the moisture or gases are generated. Therefore, this sealing needs to not only shield the sealed inside space from the outside, but also to adsorb the moisture and gases within the sealed inside space.

Figure 1A:
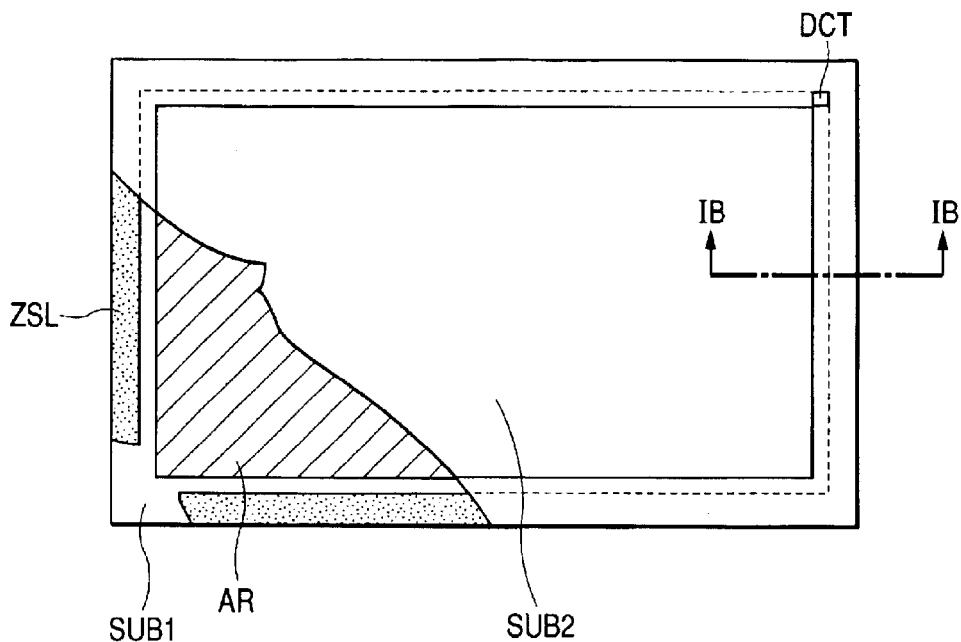
FIG. 1A is a partly cutaway schematic plan view of an embodiment of a display device according to the present invention.
Figure 1B:
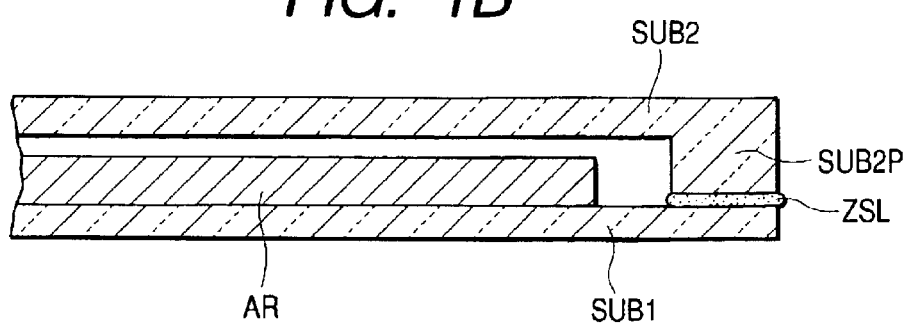
FIG. 1B is a sectional view of a main part taken on line IB—IB of FIG. 1A.

FIGS. 1A and 1B are schematic views showing the structure of an embodiment of the display device according to the present invention. FIG. 1A is a partially cut-away plan view of the display device as viewed form the side of the second substrate SUB2, and FIG. 1B is a cross-sectional view of a main part taken along line IB—IB of FIG. 1A. In FIGS. 1A and 1B, reference character SUB1 denotes a first substrate, AR is a display area, ZSL is an adhesive layer composed chiefly of a material derived from a sol-gel solution), and DCT is a dehumidifying agent. It is noted that the dehumidifying agent DCT may be a material in which a deoxygenating agent (for example, iron oxide FeO, iron powder or the like) is kneaded with a rubber material such as silicone rubber, urethane rubber, epichlorohydrin rubber.

Figure 2:
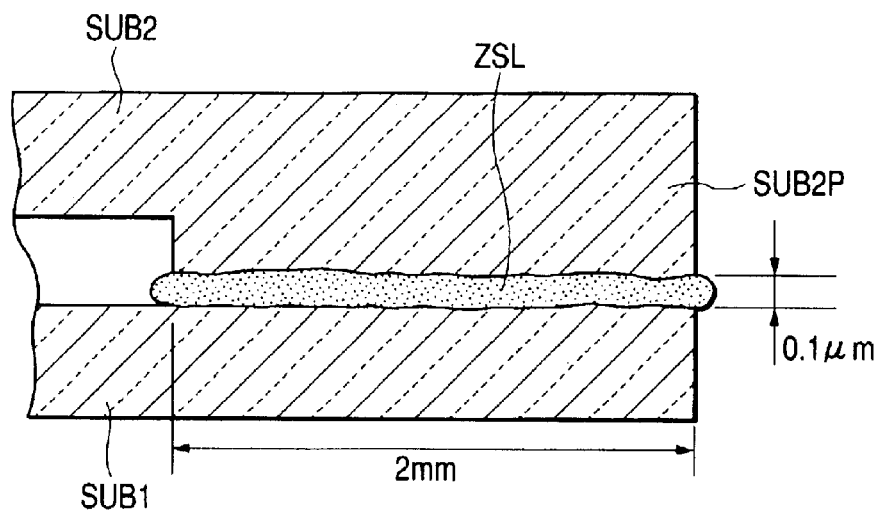
FIG. 2 is an enlarged sectional view schematically showing a sealing state of a sealing portion of a first substrate and a second substrate in FIG. 1.

FIG. 2 is an enlarged cross-sectional view schematically showing a sealed state of sealed portions of the first substrate SUB1 and the second substrate SUB2 in FIG. 1B. By using the structure having a protruding portion, a thickness of the adhesive layer ZSL which provides excellent hermetic properties can be chosen in a range of from 1.0 to 3.0 $\mu$m irrespective of thicknesses of display pixels and active elements in the display area. The adhesive layer ZSL composed chiefly of a material derived from a sol-gel solution is present as an extremely thin film between facing surfaces (fixing surfaces) of the first substrate SUB1 and the second substrate SUB2, and is attached to each of the first and second substrates SUB1, SUB2 strongly and hermetically as a result of the sol-gel reaction, and thereby seals the two substrates SUB1, SUB2 together. The sealed portion, that is, the facing portions of the first substrate SUB1 and the second substrate SUB2 is formed of a protruding SUB2P which surrounds the display area AR and protrudes toward the first substrate SUB1 from the second substrate SUB2 and an inner surface of the first substrate SUB1.

A width of the protruding portion SUB2P as measured on the substrate is approximately 2 mm. The film thickness of the adhesive layer ZSL composed chiefly of a material derived from a sol-gel solution present in the sealed portion is not more than 2.0 $\mu$m, preferably not more than 1.0 $\mu$m. Therefore, moisture or gases rarely penetrate into the sealed space between the first and second substrates SUB1, SUB2 from the ambient atmosphere after sealing of the substrates SUB1, SUB2. Accordingly, a useful display device can be realized by bonding and sealing the first and second substrates SUB1, SUB2 merely with the adhesive layer ZSL composed chiefly of a material derived from a sol-gel solution.

If an adsorbent DCT is provided inside of the sealed envelope as shown in FIG. 1A, moisture remaining or occurring in the inside can be adsorbed to achieve a long lifetime. Further, when a free-oxygen absorber is provided together with the adsorbent, they suppress deterioration in constituent components in the display area due to oxygen gases produced inside. Further, the adsorbent or the free-oxygen absorber or a combination of both can be also provided inside of the sealed envelope in the state kneaded with the rubber material. The inside of the sealed envelope is filled with an inert gas such as nitrogen gas. The above description is true for the following embodiments.

According to the present embodiment, there can be provided a display device which blocks penetration of moisture or gases via the facing portions of the peripheries of the two substrates, and which reduces deterioration in characteristics caused by gases evolving in the space inside the two substrates sealed together or gases which may enter from the outside, and thereby ensures a good image display over a long period of time.

Figure 3:
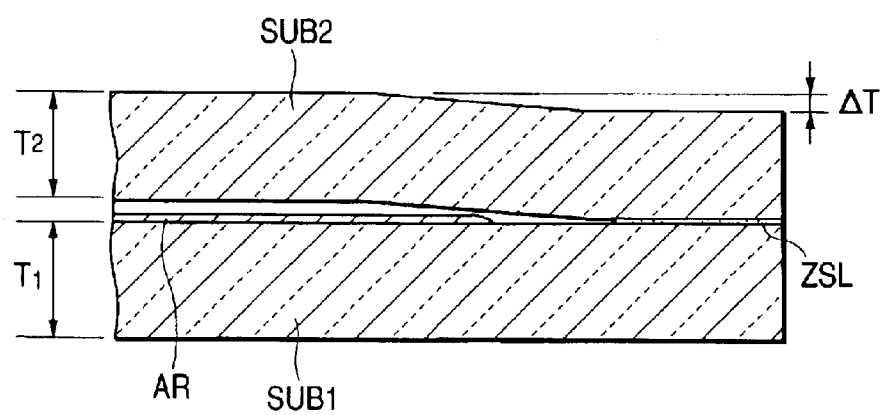
FIG. 3 is a schematic sectional view similar to FIG. 2 showing a structure of another embodiment of a display device according to the present invention.

FIG. 3 is a schematic view similar to FIG. 2, showing the configuration of another embodiment of the display device according to the present invention. In the aforementioned embodiment, the facing surfaces of the first and second substrates SUB1, SUB2 comprise the protruding portion SUB2P surrounding the display area AR and protruding toward the first substrate side SUB1 from the second substrate SUB2 and the inner surface of the first substrate SUB1. In the present embodiment, both the first substrate SUB1 and the second substrate SUB2 are formed of flat plates, and the adhesive layer ZSL composed chiefly of a material derived from a sol-gel solution is disposed between the facing surfaces of the peripheries of the two substrates SUB1, SUB2 moved toward each other due to warping of the two substrates SUB1, SUB2.

Consider a case in which the thicknesses T1, T2 of the first and second substrates SUB1, SUB2, respectively, are, for example, 0.5 mm or 0.7 mm, that is, the first and second substrates SUB1, SUB2 are made of thin glass. Even when the two substrates SUB1, SUB2 are superimposed one upon another with some spacing therebetween at the center of the two substrates, their peripheries contact each other. The adhesive layer ZSL composed chiefly of a material derived from a sol-gel solution is disposed between the contact surfaces, and then if a small pressure is applied from the side of the second substrate SUB2, the periphery of the second substrate SUB1 is warped toward the first substrate SUB1 by ΔT as shown in FIG. 3, and the second substrate SUB2 is bonded and sealed at its warped periphery to the first substrate SUB1. The above is true for the embodiments described later.

It is needless to say that a rubber member may be disposed on the sealed inside which has been kneaded with the adsorbent and free-oxygen absorber, or at least one of them, as explained in the above-described embodiment. Other structures and effects are similar to those of the above-described embodiment. Also in the present embodiment, in the arrangement which blocks the penetration of moisture or gases via the facing portions at the peripheries of the two substrates and is provided with the rubber member which has been kneaded with the adsorbent or the free-oxygen absorber or at least one of them in the sealed inside, it is possible to provide a display device which reduces the deterioration in characteristics due to gases evolving in the space between the two substrates sealed together or gases which may penetrate from the outside, to ensure a good image display over a long period of time.

Figure 4A:
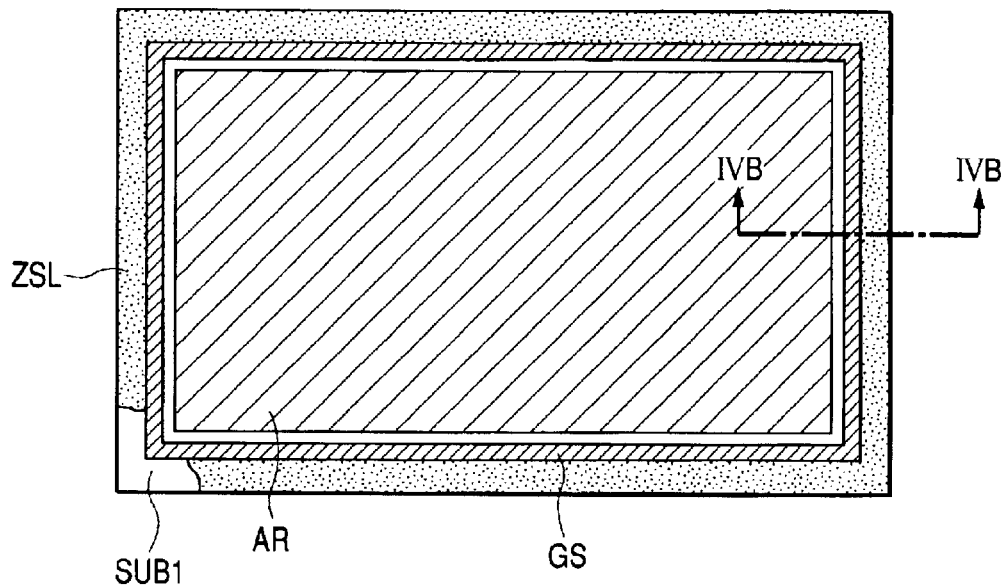
FIG. 4A is a schematic plan view showing a structure of another embodiment of a display device according to the present invention.
Figure 4B:
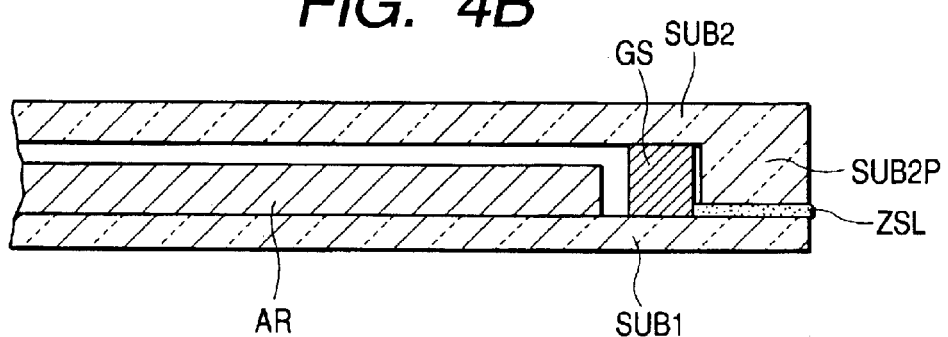
FIG. 4B is a sectional view of a main part taken on line IVB—IVB of FIG. 4A.

FIGS. 4A and 4B are schematic views of a structure of another embodiment according to the present invention. FIG. 4A is a plan view of the inner surface of the first substrate SUB1 as viewed from the second substrate side SUB2, and FIG. 4B is a sectional view of a main part including the second substrate SUB2 taken along line IVB—IVB of FIG. 4A. In FIGS. 4A and 4B, the reference character GS denotes a rubber member, and the same reference characters as those in FIG. 1A to FIG. 3 correspond to the functionally similar portions. In the present embodiment, an adhesive layer ZSL composed chiefly of a material derived from a sol-gel solution similar to that explained in FIGS. 1A and 1B is interposed between the facing surfaces of the peripheries of the first substrate SUB1 and the second substrate SUB2, and a picture-frame-like rubber GS is disposed outside of the display area AR, but within a border formed by the adhesive layer ZSL, between the two substrates SUB1, SUB2.

The picture-frame-like rubber GS is disposed outside of the display area, and the adhesive layer ZSL composed chiefly of a material derived from a sol-gel solution is interposed between the facing surfaces of the first substrate SUB1 and the second substrate SUB2 in the protruding portion SUB2P outside of the picture-frame-like rubber GS. Pressure is applied to the rubber GS to compress the rubber GS, and then the two substrates SUB1, SUB2 are bonded and sealed together by the adhesive layer ZSL composed chiefly of a material derived from a sol-gel solution. If a dehumidifying agent or a free-oxgen absorber or both of them are kneaded with a material of the rubber GS, the enhanced effects of suppressing moisture absorption or suppressing oxidation is obtained.

Also in the present embodiment, it is possible to provide a display device which blocks penetration of moisture or gases via the facing portions at the peripheries of the two substrates SUB1 and SUB2, and if a dehumidifying agent or a free-oxygen absorber or both of them are kneaded with a material of the rubber GS, even when, in the producing process, gases evolve within the space between the substrates sealed together, moisture or gases are generated from the adhesive layer, or gases may penetrate from the outside, they are adsorbed and removed by the dehumidifying agent and/or the free-oxygen absorber kneaded with the material of the rubber GS and consequently, a good image display is ensured for a long period of time.

Figure 5:
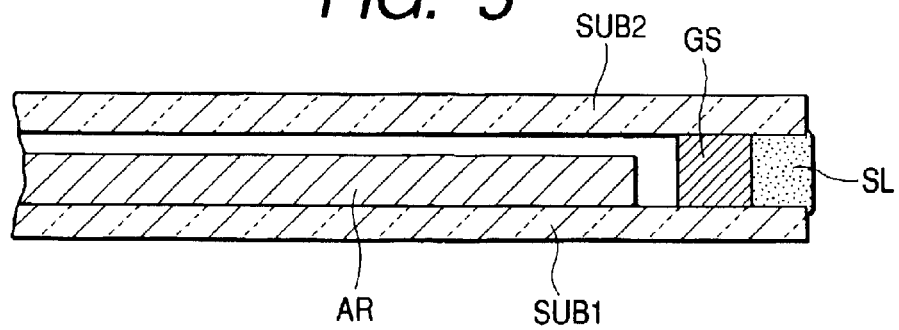
FIG. 5 is a schematic sectional view similar to FIG. 4B showing a structure of still another embodiment of a display device according to the present invention.

FIG. 5 is a schematic view similar to FIG. 4B showing a structure of still another embodiment of a display device according to the present invention. In the present embodiment, as the second substrate SUB2, use was made of a flat sheet similar to the first substrate SUB1 having no protruding portion SUB2P protruding toward the first substrate SUB1. The picture-frame-like rubber GS similar to that of the above-described embodiment is interposed between the sealed portions of the facing surfaces of the first substrate SUB1 and the second substrate SUB2, and in the state in which the rubber GS is compressed, an adhesive SL is coated on the peripheries of the two substrate SUB1, SUB2. Silicone rubber is suitable for the rubber GS, and the adhesive SL is a normally used adhesive such as an epoxy system, a urethane system, an acrylic system or the like. This adhesive is cured by a ultraviolet ray treatment or a heat treatment or a combination of both. After curing of the adhesive, application of pressure to the first substrate SUB1 and the second substrate SUB2 is removed.

Also in the present embodiment, it is possible to provide a display device which blocks penetration of moisture or gases via the facing portions at the peripheries of the two substrate SUB1 and SUB2, and if a dehumidifying agent or a free-oxygen absorber or both of them are kneaded with a material of the rubber GS, gases evolving within the space sealed between the substrates, or gases which may penetrate from the outside are adsorbed and removed by the dehumidifying agent and/or the free-oxygen absorber kneaded with the material of rubber GS, and consequently, a good image display is ensured for a long period of time.

Figure 6A:
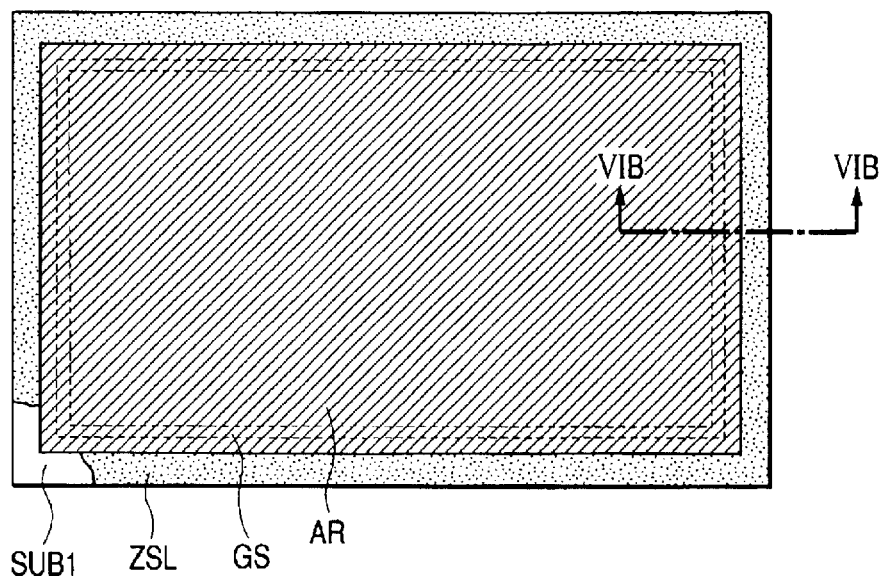
FIG. 6A is a schematic plan view showing a structure of another embodiment of a display device according to the present invention.
Figure 6B:
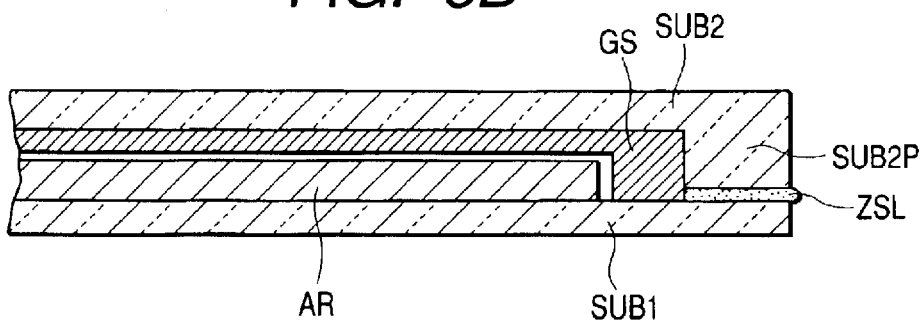
FIG. 6B is a sectional view of a main part taken on line VIB—VIB of FIG. 6A.

FIGS. 6A and 6B are schematic views of a structure of another embodiment of a display device according to the present invention. FIG. 6A is a plan view of the inner surface of the first substrate SUB1 as viewed from the side of the second substrate SUB2, and FIG. 6B is a cross-sectional view of a main part including the second substrate SUB2 taken along line VIB—VIB of FIG. 6A. In FIGS. 6A and 6B, the reference character GS denotes sheet-like rubber, and the same reference characters as those of FIG. 1A to FIG. 4B correspond to the functionally similar portions. In the present embodiment, the adhesive layer ZSL composed chiefly of a material derived from a sol-gel solution similar to that explained in FIG. 1 is interposed between the facing surfaces of the peripheries of the first substrate SUB1 and the second substrate SUB2, and the sheet-like rubber GS is disposed inside of a border formed by the adhesive layer ZSL such that it covers the entire surface including an area of the first substrate SUB1 surrounding the display area AR and the rear surface of the display area (which corresponds to an inner surface of the second substrate SUB2). With this structure, the strength of the substrates is enhanced, and the mechanical strength against the breakage of substrates during the manufacturing process, and bending of the completed products or shocks to the completed products and the like is enhanced.

The sheet-like rubber (rubber sheet) GS is provided with a step in the vicinity of the sealed portion, the sheet-like rubber (rubber sheet) GS is disposed to cover the entire area of the inner surface of the second substrate SUB2 including the area surrounding the display area AR, and further, at the protruding portion SUB2P outside of the sheet-like rubber GS, the adhesive layer ZSL composed chiefly of a material derived from a sol-gel solution is interposed between the facing surfaces of the first substrate SUB1 and the second substrate SUB2. Pressure is applied to compress the rubber GS inside of the protruding portion SUB2P, and the two substrates SUB1, SUB2 are bonded and sealed together by the adhesive layer ZSL composed chiefly of a material derived from a sol-gel solution. Silicone rubber is suitable for the sheet-like rubber GS. And, if a dehumidifying agent or a free-oxygen absorber or both of them are kneaded with a material of the rubber GS, the effects of suppressing moisture absorption and suppressing oxidation are enhanced.

Also in the present embodiment, it is possible to provide a display device which blocks penetration of moisture or gases via the facing portions at the peripheries of the two substrates SUB1 and SUB2, and if a dehumidifying agent or a free-oxygen absorber or both of them are kneaded with a material of rubber GS, gases evolving within the space between the substrates SUB1 and SUB2 sealed, moisture or gases generated from the adhesive layer, or gases which may penetrate from the outside are adsorbed and removed by the dehumidifying agent and/or the free-oxygen absorber kneaded with the material of the rubber GS, and consequently, a good image display is ensured for a longer period of time.

It is needless to say that the sheet-like rubber GS can be disposed to cover a portion but not all of the area of the second substrate SUB2 directly facing the display area AR on the substrate SUB1.

Figure 7:
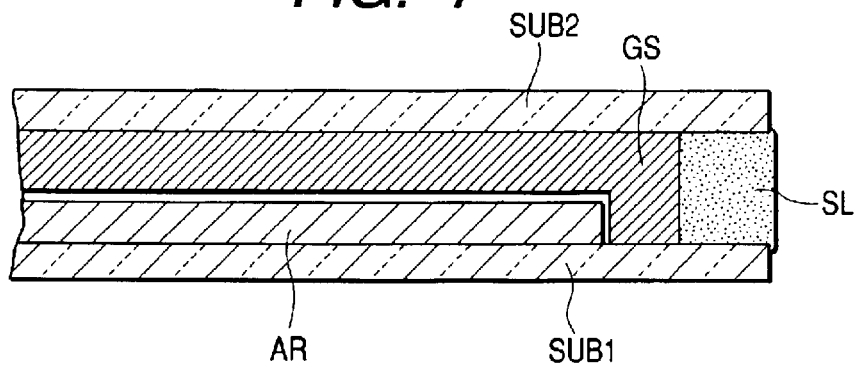
FIG. 7 is a schematic sectional view similar to FIG. 6B showing a structure of still another embodiment of a display device according to the present invention.

FIG. 7 is a schematic view similar to FIG. 6B, showing another embodiment of a display device according to the present invention. In the present embodiment, as the second substrate SUB2, use was made of a flat glass plate similar to the first substrate SUB1 having no protruding portion SUB2P protruding toward the first substrate SUB1. Sheet-like rubber GS similar to that of the embodiment explained in connection with FIGS. 6A, 6B is interposed between the sealed portions of the facing surfaces of the first substrate SUB1 and the second substrate SUB2 and covers the entire area of the inner surface of the second substrate SUB2, and in the state in which the rubber GS in the sealed portions is compressed, or before the rubber GS is compressed, an adhesive SL is coated on the peripheries of the two substrates SUB1, SUB2. Silicone rubber is suitable for the rubber GS, and the adhesive SL is a normally used adhesive such as an epoxy system, a urethane system, an acrylic system or the like. This adhesive is cured by a ultraviolet ray treatment or a heat treatment or a combination of both. After curing of the adhesive, application of pressure to the first substrate SUB1 and the second substrate SUB2 is removed.

Also in the present embodiment, it is possible to provide a display device which blocks penetration of moisture or gases via the facing portions at the peripheries of the two substrate SUB1 and SUB2, and if a dehumidifying agent or a free-oxygen absorber or both of them are kneaded with a material of the rubber GS, gases evolving within the space between the two substrates sealed, or gases which may penetrate from the outside are adsorbed and removed by the dehumidifying agent and/or the free-oxygen absorber kneaded with the material of the rubber GS, and consequently, a good image display is ensured for a long period of time.

It is needless to say that the sheet-like rubber GS can be disposed to cover a portion but not all of the area of the second substrate SUB2 directly facing the display area AR on the substrate SUB1.

Figure 8:
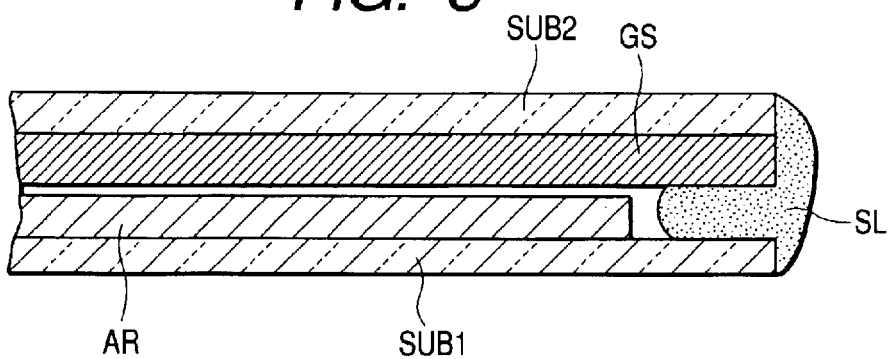
FIG. 8 is a schematic sectional view similar to FIG. 7 showing a structure of still another embodiment of a display device according to the present invention.

FIG. 8 is a schematic view similar to FIG. 7, showing another embodiment of a display device according to the present invention. In the embodiment of FIG. 7, the sheet-like rubber GS provided with a step in the vicinity of the sealed portions is disposed at a position retracted from the sealed portions of the facing surfaces of the first and second substrates SUB1, SUB2 toward the display area AR. However, in the present embodiment, the sheet-like rubber GS is a flat sheet having no step, and the ends of the sheet-like rubber GS are extended to be exposed at the ends of the first and second substrates SUB1, SUB2.

It is needless to say that the sheet-like rubber GS can be disposed to cover a portion but not all of the area of the second substrate SUB2 directly facing the display area AR on the substrate SUB1.

An adhesive SL is coated between the first substrate SUB1 and the sheet-like rubber GS in the sealed portions and then is compressed. The adhesive is one similar to that used in the embodiment explained in connection with FIG. 7. In this compressed state, a ultraviolet ray irradiation or heat treatment is applied to cure the adhesive SL. At this time, a portion of the adhesive SL is extruded outside of the ends of the first and second substrates SUB1, SUB2, covers the ends of the first and second substrates SUB1, SUB2 so as to cover the sheet-like rubber GS, and is cured. Therefore, the end faces of the sheet-like rubber GS is also shielded from the ambient atmosphere by the adhesive SL. The sheet-like rubber GS serves as a cushion for protecting the display area AR when the display device bumps against something.

Also in the present embodiment, it is possible to provide a display device which blocks penetration of moisture or gases via the facing portions at the peripheries of the substrate SUB1 and SUB2, and if a dehumidifying agent or a free-oxygen absorber or both of them are kneaded with a material of the rubber GS, gases evolving within the space between the two substrates sealed, or gases which may penetrate from the outside are adsorbed and removed by the dehumidifying agent and/or the free-oxygen absorber kneaded with the material of the rubber GS, and consequently, a good image display is ensured for a longer period of time.

Figure 9:
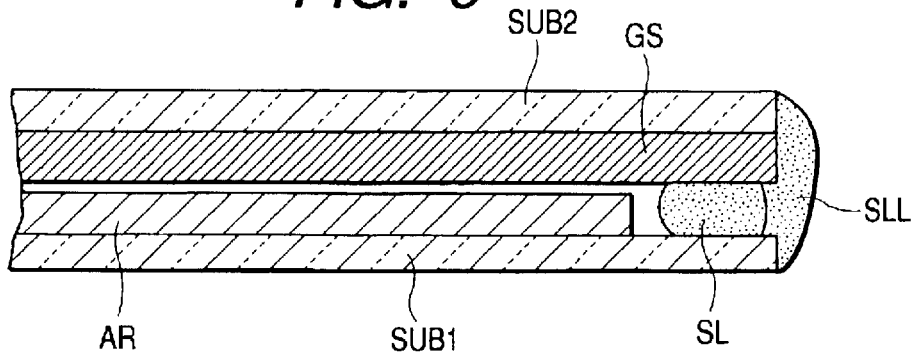
FIG. 9 is a schematic sectional view similar to FIG. 8 showing a structure of still another embodiment of a display device according to the present invention.

FIG. 9 is a schematic view similar to FIG. 8, showing another embodiment of a display device according to the present invention. In the embodiment of FIG. 8, a portion of the adhesive SL coated in the vicinity of the sealed portion is extruded outside of the ends of the first and second substrates SUB1, SUB2, covers the ends of the first and second substrates SUB1, SUB2 so as to cover the sheet-like rubber GS, and then is cured. However, in the present embodiment, the adhesive SL is coated between the first substrate SUB1 and the sheet-like rubber GS in the sealed portions so that the adhesive SL is not extruded outside of the ends of the first and second substrates SUB1, SUB2 by compression of the sealed portions, or such that the amount of the adhesive SL to be extruded is not much.

After the adhesive SL has been cured as in the case of the embodiment explained in connection with FIG. 8, further another adhesive SLL is coated on the ends of the first and second substrates SUB1, SUB2 and the sheet-like rubber GS and is cured. In this case, the other adhesive SLL may be the same as the adhesive SL or may be different therefrom. Thus, the end face of the sheet-like rubber GS is also shielded from the ambient atmosphere by the adhesive SL (and/or the other adhesive SLL).

It is needless to say that the sheet-like rubber GS can be disposed to cover a portion but not all of the area of the second substrate SUB2 directly facing the display area AR on the substrate SUB1.

The sheet-like rubber GS serves as a cushion for protecting the display area AR when the display device bumps against something.

Also in the present embodiment, it is possible to provide a display device which blocks penetration of moisture or gases via the facing portions at the peripheries of the two substrate SUB1 and SUB2, and if a dehumidifying agent or a free-oxygen absorber or both of them are kneaded with a material of the rubber GS, gases evolving within the space between the substrates sealed, or gases which may penetrate from the outside are adsorbed and removed by the dehumidifying agent and/or the free-oxygen absorber kneaded with the material of the rubber GS, and consequently, a good image display is ensured for a longer period of time.

Next, an adhesive layer composed chiefly of a material derived from a sol-gel solution, an adhesive, a case of presence of a rubber material and a case of absence a rubber material, and sealing characteristics of the display device of the present invention and advantages thereof will be explained in detail about the verified results using sample panels together with concrete materials and conditions.

Case of Presence of Rubber (Picture-Frame-Like Rubber)

A substrate made of borosilicate glass of 30 mm in length, 40 mm in breadth, and 0.5 mm in thickness as a substrate is placed on evaporation equipment. An organic film used for an organic electroluminescent element was formed by vacuum evaporation in an area of 22 mm in length and 32 mm in breadth of the glass substrate. Next, after producing a positive gas pressure differential between the evaporation equipment and the external environment by introducing nitrogen gas into the evaporation equipment, the organic film is moved to a glove box filled with a nitrogen gas adjusted to a temperature of 25° C.±3° C., and a rectangular picture-frame like silicone rubber (trade name "Keiju" manufactured by Mitsubishi Plastics Inc. (Tokyo, Japan)) of 1 mm in width and 30 $\mu$m in thickness was disposed on the glass substrate with a marginal area of 1 mm in width of the glass substrate exposed.

Soda-lime glass of 1 mm in thickness is placed on the silicone rubber, which is pressed so that pressure not less than 1 kg/cm$^2$ is applied to a frame portion of the frame-like silicone rubber. Thus, the silicone rubber is brought into intimate contact with the glass substrate. The sample was taken out into air (25° C. in temperature, 35% to 70% RH) in the normal ambient atmosphere with the applied pressure being maintained on the sample. Incidentally, although the silicone rubber has a high gas permeability, the inside of the organic electroluminescent element is filled with nitrogens, there occurs no counter diffusion between the sealed inside of the organic electroluminescent element and the ambient atmosphere due to permeating of gases through the silicone rubber. An adhesive-layer-forming solution specified in FIG. 11 was filled into a gap between ends of the substrates SUB1, SUB2 sandwiching the silicone rubber therebetween while maintaining the pressure applied on the sample.

FIG. 10 is a table for explaining an example of a specification of the adhesive-layer-forming solution used for a sample panel for verifying the advantages of the present invention. In FIG. 10, the adhesive-layer-forming solution was denoted merely as an adhesive. The adhesive-layer-forming solution is a sol-gel solution composed chiefly of silicon alkoxide. The silicon alkoxide is mixed with ultrafine powders (0.07 $\mu$m in average particle diameter) of silicon oxide (SiO$_2$). The mixture ratio between the former and the latter is 80:20.

Figure 11:
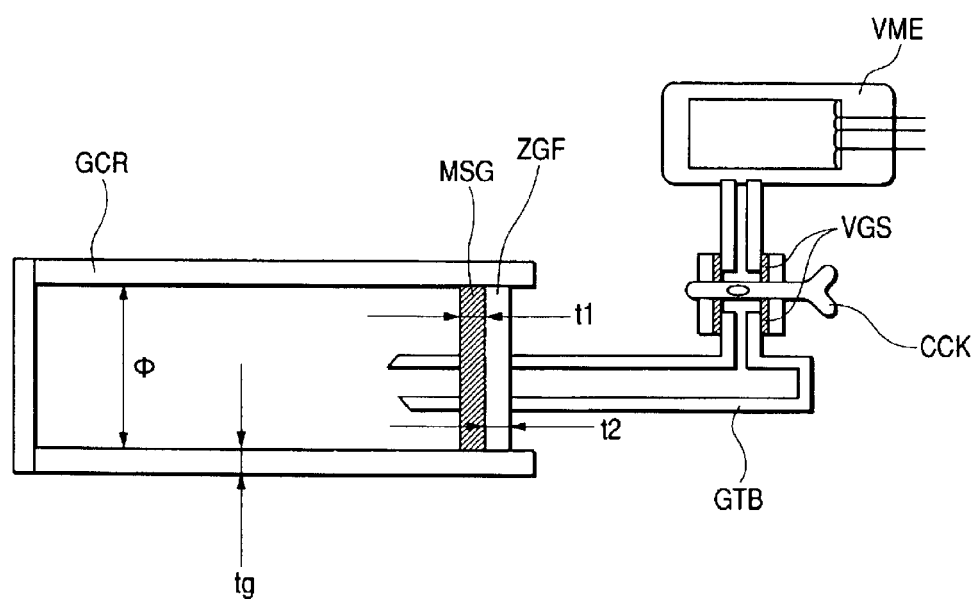
FIG. 11 is a schematic sectional view for explaining a structure of experimental equipment for carrying out a gas permeability test of the sample panel.

The sol-gel solution specified in FIG. 11 was filled into the gap between the ends of the substrates SUB1, SUB2 and was dried for 10 minutes at 70° C.±2° C. while the substrates are pressed against each other. By this drying, the glass, the sol-gel solution and the silicone rubber form a siloxane (Si—O—Si) and silanol coupling (Si—OH), thereby are irmly bonded together, and consequently, forms a thin film which gases can not permeate, as shown as the adhesive layer ZSL in FIG. 2.

In a usual way of using the sol-gel solution, the thickness of formed thin films is in a range of from 1.0 to 3.0 $\mu$m. The thin films have micropores, allows a little amount of gases to permeate it, but when a distance between the sealed inside of the organic electroluminescent element and the ambient atmosphere is in a range of from $1\times10^3$ to $3\times10^4$ times the thickness of the thin film, the SiO$_2$ ultrafine particles contained as fillers function as a barrier against the gases, the sol-gel solution permeates the surface of the silicone rubber also to form a thin film, and consequently, the gas permeability is extremely reduced. In view of a tradeoff between the length of a sealed portion for securing the sealing function and the drying time which increases with the length of the sealed portion, the practical length of the sealed portion is preferably in a range of from $2\times10^3$ to $3\times10^3$ times the thickness of the thin film. Further, gases having a large molecular weight evolving from a solvent used for a sol-gel solution is hard to permeate the silicone rubber, and the solvent and the gases evolving from the solvent do not diffuse into the organic electroluminescent element.

FIG. 11 is a schematic view for explaining a structure of experimental equipment for carrying out a gas permeability test of a sample panel. In FIG. 11, reference character GCR denotes a glass container, MSG is a silicone rubber sheet superposed in many layers, ZGF is a sol-gel film, GTB is a glass tube, VME is a vacuum gauge, VGS is vacuum grease, and CCK is a gate valve. The ratio between a diameter $\phi$ of the glass container GCR, a thickness tg of the glass container GCR, a thickness t1 of the silicone rubber sheet MSG, and a thickness t2 of the sol-gel film ZGF is given by $\phi:tg:t1:t2=10:3:1:1$ FIG. 12 is a table for explaining the test results on gas permeability of the sample panel according to the experimental equipment of FIG. 11. The vacuum grease VGS is coated between the vacuum gauge VME and the gate valve CCK to prevent the interference of the ambient atmosphere with the glass tube GTB during the operation of the gate valve CCK. At the time of environmental tests of the glass container GCR (left under environments of various test conditions), the gate valve CCK is closed and the vacuum gauge VME is disconnected from the glass container GCR (glass container GCR), and at the time of subsequent gas permeability tests (hermeticity evaluation measurement), the gate valve CCK is opened and the vacuum gauge VME is connected to the glass container GCR through the glass tube GTB to measure vacuum pressures.

Here, the glass container GCR sealed by the silicone rubber sheet MSG and the sol-gel film ZGF is left under environments in which six kinds of the test conditions are set to measure vacuum pressures (initial vacuum pressures) before being left in the specified conditions, and vacuum pressures after having been left in the specified conditions. The results are shown in FIG. 12. As shown in FIG. 12, it has been verified that in any test conditions, even after having been left in the specified conditions, the vacuum pressures within the glass container GCR have hardly changed, and the hermeticity is maintained. It is noted that the hermeticity is defined as follows for the sake of convenience.

Definition of Hermeticity

Where an initial vacuum pressure is $1 \times 10^{-5}$ Pa, a deterioration in the vacuum pressure is not more than 1 figure after a time elapse of 10 k hours under the environment of a temperature from $-40°$ C. to $70°$ C. and a humidity of 80% RH.

The hemeticity similar to the above was obtained by the test using an aluminum sheet of 1 mm in thickness in place of soda-lime glass by the same method as that described above. It is considered that since a thin oxide film ($Al_2O_3$) is formed on the surface of aluminum, siloxane, and silanol coupling were formed with silicon similarly to the above. Further, the hermeticity between other metals and glass is desireed to be further enhanced, the following rubber can be used: urethane rubber or epichlorohydrine rubber whose gas permeability is lower by 2 figures as compared with silicone rubber, or a combination of silicone rubber and a polyurethane adhesive (for example, Trade Name SF291 or 295 manufactured by Marine Service Kojima Co., Ltd., (Kanagawa Prefecture, Japan)). And, they are cured for 45 minutes at a temperature of $20°$ C.$\pm 5°$ C., humidity of 65%$\pm$10% RH, then even if the vacuum pressure is lowered by 1 figure ($1.0 \times 10^{-4}$ Pa level), the vacuum pressures were approximately the same level after having been left in various environments.

However, rubbers other than silicone rubber decreases in affinity with glass, metal or the like, and therefore, it is desirable to increase the force applied to the rubber by 50% or so. Further, as an epoxy system adhesive, the trade name STAYSTIK No. 432 manufactured by Techno Alpha Co., Ltd. (Tokyo, Japan) was used to conduct a test at a temperature of $80°$ C. for 30 minutes of curing time. It has been then found out that there is little difference between the initial vacuum pressure and the vacuum pressure after test. In the following, the aforementioned affinity will be explained.

Figure 13:
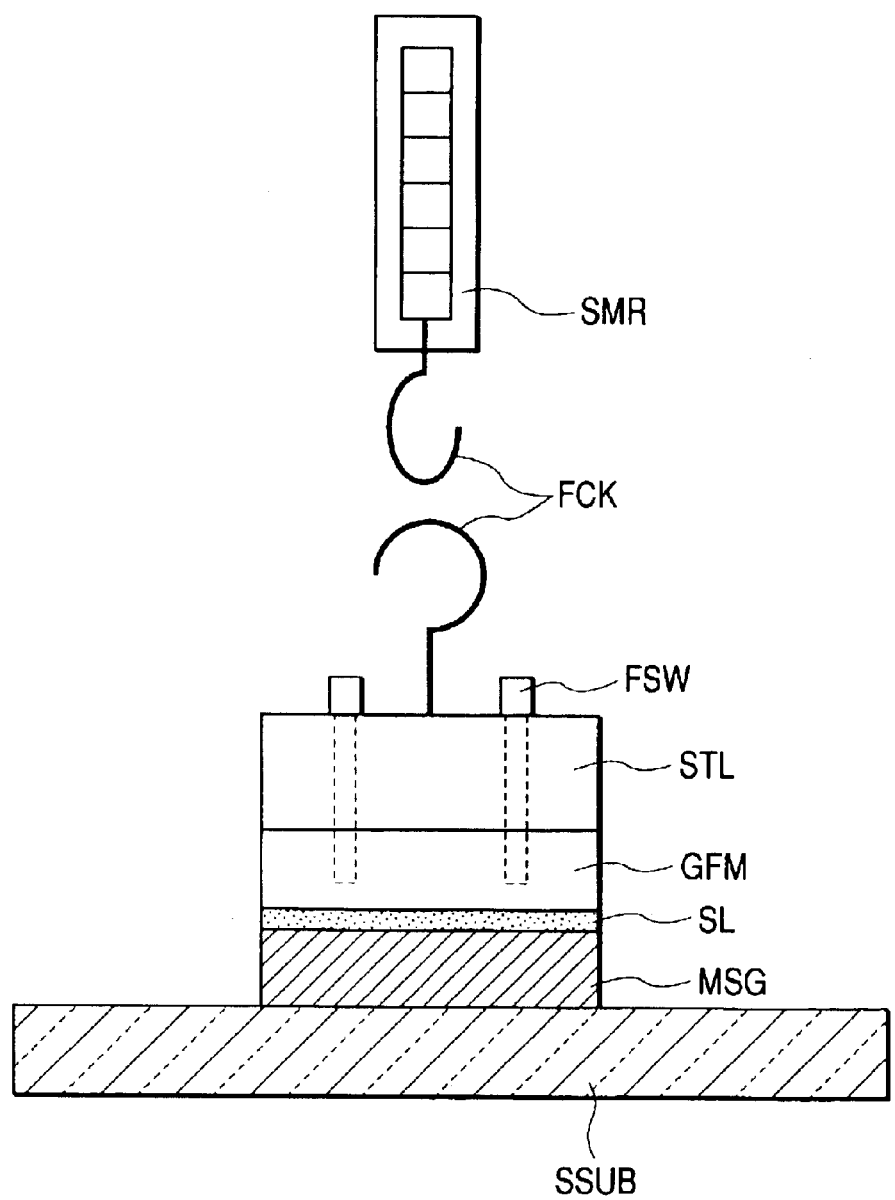
FIG. 13 is a schematic view for explaining an example of a structure of an affinity evaluation device for evaluating the affinity between rubber and a substrate.

FIG. 13 is a schematic view for explaining a structural example of an affinity evaluating device for evaluating the affinity of rubbers and substrates. In FIG. 13, reference character SSUB denotes a substrate (such as glass, metal), MSG is a rubber for a test, SL is an adhesive, GFM is a metal plate for fixing the rubber, FSW is a screw, STL is a testing fixture, SMR is a spring balance, and FCK is a hook.

In the affinity evaluating device shown in FIG. 13, both the substrate SSUB and the rubber MSG were washed with a neutral detergent, then were washed in combination with rubbing using tap water and pure water, and then were dried for 10 minutes with a vacuum pressure not more than $5 \times 10^{-1}$ Pa in a vacuum desiccator. Thereafter, the rubber MSG is fixed to the metal plate for fixing rubber GFM with an adhesive in the atmosphere of a temperature of $25°$ C.$\pm 5°$ C. and a humidity of 50%$\pm$1% RH, screwed to the testing fixture STL having a hook by the screw FSW, and is pressed for 10 minutes by the force of 1 kg/cm$^2$. Thus, the rubber for a test MSG is stuck to the substrate SSUB.

Within a minute after that, the hook FCK of the testing fixture STL having the hook FCK is put on the hook FCK of the spring balance SMR to pull up the spring balance SMR. Graduations of the spring balance when the rubber MSG begins to peel off from the substrate SSUB by the aforementioned pulling are read to use it as a measure of affinity. This affinity test was conducted including the epichlorohydrine rubber having the lowest gas permeability among commercially available rubber sheets.

FIG. 14 is a table summarizing the results of the affinity test by the affinity evaluating device of FIG. 13. Here, the test results are shown which are on substrates made of a glass plate, an aluminum plate, and a Japanese Industrial Standards SUS304 stainless steel plate. The data in FIG. 14 shows readings (force) gf of the spring balance at the times when the rubbers are peeled off in cases where silicone rubber, urethane rubber, and epichlorohydrine rubber are fixed the respective substrates to conduct a test, and their permeability (cc·cm/cm$^2$·sec·atm).

The glass and metal sheet have flatness of a level of normally commercially available articles, and are not specially polished articles. There are those rubbers which are larger in gas permeability than the data of FIG. 14, but since nitrogen gas of the same pressure as the atmospheric pressure is sealed into the element, there is no pressure difference (approximately 0 Pa) from the outside, and for example, even in the case of a nominal 21-inch-diagonal (51-cm-diagonal) substrate, a sectional area (0.003 mm$\times$1500 mm=4.5 mm$^2$ of an adhesive layer circling on the substrate is also small. Therefore, the gas permeation for a short period of time poses no practical problem as supposed from the data, and a sol-gel film or an adhesive is coated outside of the edges of the attached substrates of the panel in the case of a display device whereby long-term hermeticity is maintained.

Case of Absence of Rubber

As in the case of presence of the rubber (picture-frame-like rubber), a substrate made of borosilicate glass of 30 mm in length, 40 mm in breadth and 0.5 mm in thickness was placed on the evaporation equipment. An organic film used for an organic electroluminescent element was formed by vacuum evaporation in an area of 22 mm in length and 32 mm in breadth of the glass substrate. Next, after producing a positive gas pressure differential between the evaporation equipment and the external environment by introducing nitrogen gas into the evaporation equipment, the substrate was moved to the glove box filled with a nitrogen gas adjusted to a temperature of $25°$ C.$\pm 3°$ C., and then an alkoxide hydrolysis solution composed chiefly of silicon (for example, a sol-gel coating solution manufactured by Nippan Kenkyujo Co., Ltd. (Yokohama, Japan)) was coated on the substrate with pressure adjusted such that its coating width was 1.5 mm, by moving a microburette provided at its tip with a hose at a speed of 1 cm/sec.

A soda-lime glass substrate of 1 mm in thickness was placed over the coated film, and is pressed so that a pressure not less than 1 kg/cm² was applied to the portion coated with the sol-gel solution. The sweeping speed of the microburette had been determined in advance by a preliminary experiment to obtain a thickness of the sol-gel solution such that the pressed sol-gel solution did not extend inward by 0.5 mm or more. Thereafter, the substrates were heated in a heating furnace at a temperature of 70° C.±2° C. for 10 minutes while they are pressed against each other. Thus, the glass substrates were firmly bonded together.

FIG. 15 is a table for explaining composition examples of the sol-gel solutions used in the case where the rubber is not present. The sol-gel solutions of compositions shown in FIG. 15 were used to conduct the test. The strong adhesive strength were obtained for all the compositions.

Thin films obtained from the sol-gel solutions have micropores, and gases sometimes penetrate via the micropores when the sealed substrates are left in the shelf for a long period of time. When this adhesive structure was observed by a scanning electron microscope (SEM), a thickness of the adhesive layer turned out to be about 0.1 µm as shown in FIG. 2. However, the width of the sealed portion of the glass substrates is 2 mm, which is about 2×10⁴ times a thickness of a film through which gases may penetrate due to its micropores, and therefore, there are no problems of penetration of gases into the sealed inside.

Figure 16:
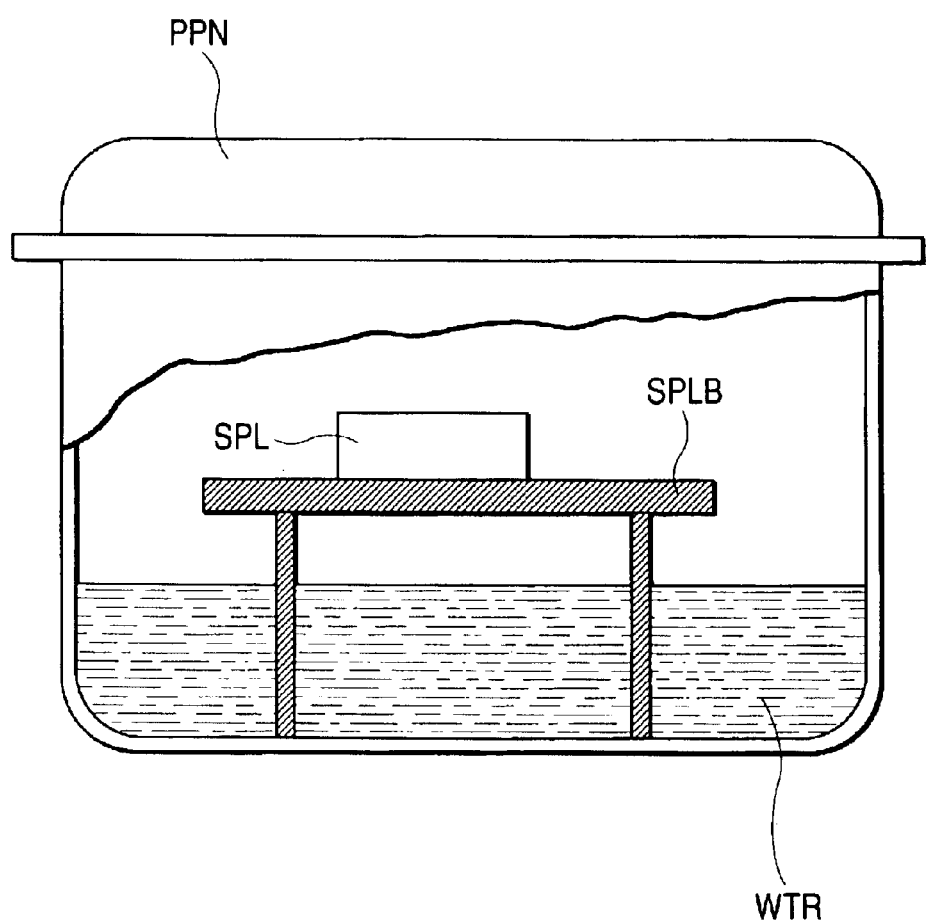
FIG. 16 is a schematic view of a gas-permeability verifying device of a sol-gel film.
Figure 17:
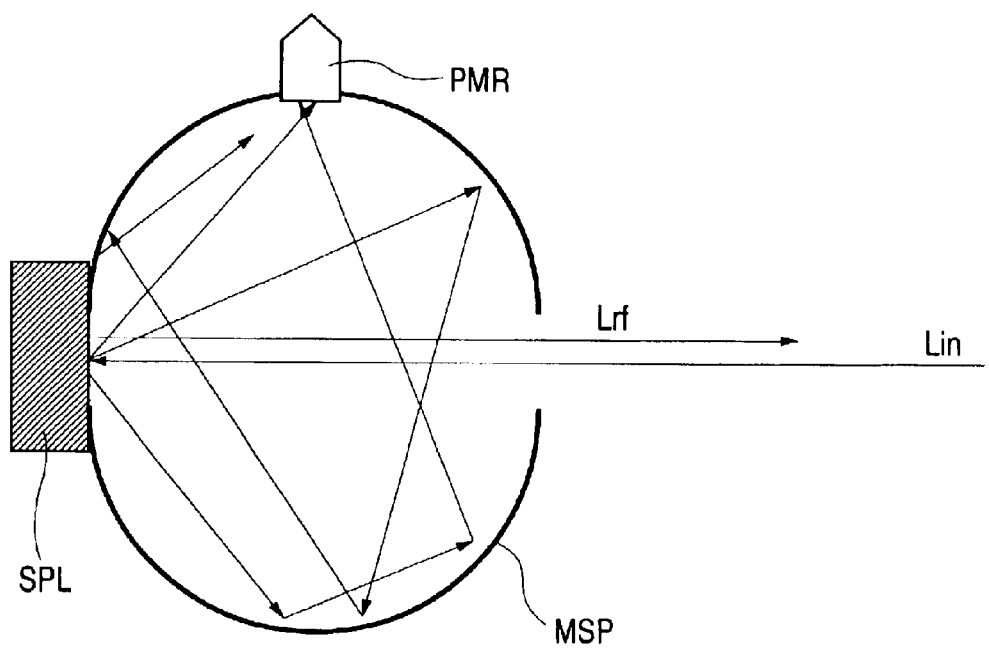
FIG. 17 is a diffuse reflectance measuring device for measuring an evolution of moisture within a sample.

To verify the gas permeability of the sol-gel solution, the following experiments were carried out. FIG. 16 is a schematic view of a verifying device for gas permeability of the sol-gel solution. In FIG. 16, reference character PPN denotes a pressure cooker, SPLB is a sample stage, and SPL is a sample of two substrates sealed together. Water WTR is in the pressure cooker PPN at its water level not reaching the sample SPL. Further, FIG. 17 shows a diffuse reflectance measuring device for measuring occurrence of humidity within the sample. Reference character MPS denotes an integrating sphere, and PMR is a photomultiplier.

Two glass plates having an area 30 mm×40 mm were washed with a neutral detergent and then were washed sufficiently with tap water and pure water. A sol-gel solution is coated on the two glass plates in a glove box filled with nitrogen gas, and were dried at a temperature of 70° C.±2° C. similarly to the aforementioned method. This sample SPL is immersed into a 0.5% caustic soda (NaOH) solution for 24 hours, which is the severest test condition, then they were washed sufficiently with tap water and pure water, and were placed on the sample stage SPLB of the pressure cooker PPN shown in FIG. 16. Then the inside of the pressure cooker PPN was heated for two hours at 1.2 atmospheres.

Thereafter the samples were cooled, and the samples SPL were taken out from the pressure cooker PPN, and were sufficiently washed again with a neutral detergent, tap water and pure water, and were dried. These samples SPL were set at the integrating sphere MPS of the diffuse reflectance measuring device having a liquid-nitrogen-cooled observation window shown in FIG. 17, the measuring device was evacuated to 3×10⁻³ Pa, and then was cooled to a liquid nitrogen temperature (about –90° C.). In its cooled state, the sample SPL was irradiated with light Lin through the observation window, and was observed to judge whether dew condensation occurred, based upon a diffused state of regularly reflected light Lrp. Incidentally, a diffuse reflectance measuring element was omitted in FIG. 17.

The results of experiments show the samples similar to the above-explained organic electroluminescent element having no rubber have zero diffuse reflectance irrespective of the kind of the sol-gel solutions, and the dew condensation was not observed. The fact that dew condensation was not observed with the scanning electron microscope is considered due to dehumidifying caused by evacuation at the time of observation, and therefore, the adhesive surfaces magnified 500 times by an optical microscope were observed again, but no changes were observed.

Figure 18:
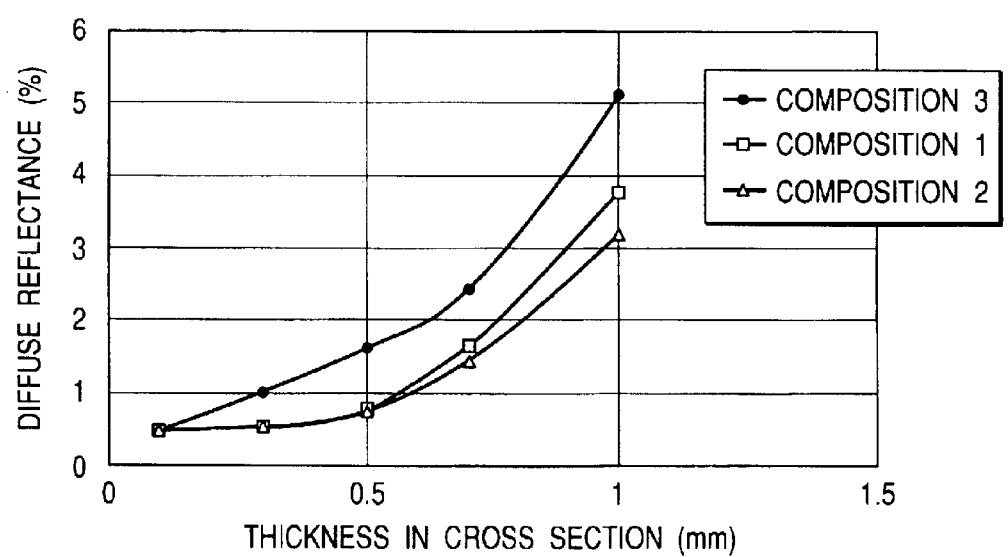
FIG. 18 is a graph showing the investigation result of the diffusion reflectance.

FIG. 18 is a graph summarizing the investigation results on diffuse reflectance. In FIG. 18, the abscissa indicates a thickness (mm) of the adhesive layers of the samples, and the ordinate indicates diffuse reflectance (%). In FIG. 18, a curve connecting solid circles shows a case of a sol-gel solution (hereinafter referred to as a composition 3) manufactured by the aforementioned Nippan Kenkyujo, a curve connecting open squares shows a case of composition 1 shown in FIG. 15, and a curve connecting open triangles shows a case of composition 2 shown in FIG. 15.

Based upon the results shown in FIG. 18, it can be judged in consideration of measurement errors that, if the diffuse reflectance is not more than 0.8%, no dew condensation occurs in view of the accuracy of the measuring device. Accordingly, to ensure the advantages provided by the aforesaid sealing method, it is understood that the adhesive layer obtained from the sol-gel solution of composition 3 needs to have a thickness not more than about 2.0 µm, and that, in the cases of the solutions of compositions 1 and 2, a thickness of the adhesive layer needs to be selected to be not more than 2.0 µm. Further, in a case where the coating width of the adhesive layer obtainable from the sol-gel solution is selected to be narrower than 2 mm, an adhesive such as an epoxy system resin can be coated on the periphery of the sealed edge, and a diffuse reflectance for a sample of 0.15 mm in width and 0.5 µm±0.8 µm in thickness was lowered to 0.5 to 0.7%.

Another Case in which Rubber is Present

If lifetime of an organic electroluminescent element needs to be further extended, or a size of an organic electroluminescent element (panel) needs to be increased, it is necessary to block the penetration of moisture through the sealed portion, to suppress deterioration in characteristics caused by gases evolving inside, and to secure its strength. In this case, it is effective to employ the structure explained in the embodiments explained in connection with FIGS. 6A to 9.

A rubber sheet similar to that used in the above-described embodiment is disposed over the approximately entire area of the inner surface of the second substrate SUB2, that is, over the rear surface (rear surface of an organic electroluminescent element) of the first substrate SUB1 including its display area. When the rubber sheet is disposed over the approximately entire area of the inner surface of the second substrate, the strength of the second substrate SUB2 is considerably enhanced. In particular, in the case where the substrates are made of glass, the thickness of the glass substrates is extremely thin as described above, and the reliability of the display device is lowered due to the occurrence of warping or breakage of the substrates during its manufacturing process, and its yield is reduced.

Such warping or breakage of the substrates is pronounced as the panel size increases. As shown in the embodiments explained in connection with FIGS. 6 to 9, when the rubber sheet is disposed on the inner surface of the second substrate SUB2, the second substrate SUB2 forms a composite structure, thereby increasing the strength of the substrate itself considerably, enabling a precision organic electroluminescent element structure because of reduction of warping, enhancing the yield, and securing high reliability of the products. Further, not only the sealing by the adhesive layer obtained from the sol-gel solution, but also the cases of using the normal adhesives explained in connection with FIGS. 5, 7 to 9 provide the above-explained advantages.

FIG. 19 is a table summarizing the sealing characteristics of the embodiments of the display device according to the present invention using rubber sheets in comparison with the conventional display device. Here, the conventional structure of the display device employs no rubber sheet, the specification 1 uses silicone rubber for the rubber sheet, the specification 2 uses urethane rubber for the rubber sheet, and the specification 3 uses epichlorohydrine rubber for the rubber sheet.

In the sealing structures explained in connection with FIGS. 1A to 4B, 6A and 6B, when an adhesive such as an epoxy resin is coated at peripheral edges of the first and second substrates SUB1, SUB2, the sealing effects can be further enhanced. Further, an adhesive layer obtained from a sol-gel solution can be also interposed between the rubber sheet GS shown in FIGS. 5 and 7 and the first substrate SUB1 (or the second substrate SUB2). Further, in the sealing structure explained in connection with FIG. 9, an adhesive layer obtained from a sol-gel solution can be used in place of the adhesive SL.

The display devices of the specifications 1, 2 and 3 shown in FIG. 19 show the cases where the adhesive layer obtained from the sol-gel solution is interposed between the first and second substrates SUB1, SUB2 in their sealing structure. The suppression of gas permeation (including moisture permeation) is remarkably suppressed as compared with the display device of the conventional sealing structure, and the total weight of the display device is not much increased, and the strength is also considerably strengthened.

While in the above-described embodiments, the sealing width is 2 mm or so in consideration of the display area of the substrate of the display device and the size of a perimeter around the display area of the substrate, it is needless to say that if the sealing width is increased, the sealing effect is further enhanced. Further, while in the above-described sealing structures, an explanation was made mainly by taking the sealing together of the two substrates made of glass only, the present invention can also be applied to the sealing of a glass substrate and a metal substrate. Further, even if the arrangement of the positions of the rubber and the adhesive between the edges of the substrates SUB2, SUB2 is reversed from those in the previous embodiments, the above-explained advantages can be obtained, but in that case, an adhesive should be selected which does not evolve an excessive amount of gases while the adhesive is cured. Furthermore, to increase affinity of rubber between substrates, a rubber not less than 0.03 mm in thickness can be brought into intimate contact with fine unevenness of the glass, and therefore, the rubber of about 0.2 mm in thickness is preferred when workability is considered.

Further, when, for example, carbon or conductive fillers such as noble metal particles are mixed into the aforesaid rubbers (picture-frame-like rubber, rubber sheet), radiation of unwanted electric fields to electronic circuits disposed on the back of the display device or to outsider can be suppressed.

For the rubbers used in the present invention, in addition to the aforementioned materials, natural rubber, isoprene rubber, butadiene rubber, styrene rubber, butyl rubber, ethylene-propylene rubber, chloroprene rubber, chlorosulfonated polyethylene (known as Hypalon (trade name) of DuPont-Dow Elastomers L.L.C., Wilmington, Del., USA), epichlorohydrin rubber, nitrile rubber, acrylic rubber, urethane rubber, polysulfide polymer (known as Thiokol, produced by Toray Industries, Inc., Tokyo, Japan), silicone rubber, and fluorocarbon rubber can be used.

Further, the present invention is not limited to the display device using the organic electroluminescent described above, but needless to say, can be likewise applied to sealing structures of other display devices for displaying by light-emitting operation similar to the organic electroluminescent, or a panel type display device such as a liquid crystal display device.

As described above, according to the present invention, the causes of deterioration of a lifetime due to oxygen or water vapor can be substantially completely eliminated by eliminating essential deteriorations in display devices employing an organic electroluminsescent element which is easily deteriorated by moisture or oxygen. Further, the adhesives can block most of gas vapors from entering the display area (organic electroluminescent-element-constituent portion), prevent adverse influences of the adhesives can be also prevented, and further, by adding conductive fillers to a rubber layer, the radiation of unwanted electric fields (EMI(Electromagnetic Interference)) can be suppressed, thereby realizing a highly reliable display device.

What is claimed is:

1. A display device comprising:
a first substrate;
a second substrate disposed to face said first substrate;
a plurality of pixels disposed in a display area on an inner surface of said first substrate;
a rubber member disposed between said first and second substrates to surround said display area, and sealing said display area from an ambient atmosphere; and
an adhesive layer sealing together said first and second substrates along peripheries thereof;
wherein said adhesive layer is derived from a sol-gel solution.

2. A display device according to claim 1, wherein said rubber member is made chiefly of one of natural rubber, isoprene rubber, butadiene rubber, styrene rubber, butyl rubber, ethylene-propylene rubber, chloroprene rubber, chlorosulfonated polyethylene, epichlorohydrin rubber, nitrile rubber, acrylic rubber, urethane rubber, polysulfide polymer, silicone rubber, and fluorocarbon rubber.

3. A display device according to claim 1, wherein said sol-gel solution contains one of ethoxy silane, and alkoxides of Si, Zr, Ti and Sn.

4. A display device comprising:
a first substrate;
a second substrate disposed to face said first substrate;
a plurality of pixels disposed in a display area on an inner surface of said first substrate;
a rubber member disposed between said first and second substrates to surround said display area, and sealing said display area from an ambient atmosphere; and
an adhesive layer sealing together said first and second substrates along peripheries thereof;
wherein said adhesive layer is made of one of a photo-curable adhesive and a thermosetting adhesive.

5. A display device according to claim 4, wherein said rubber member is made chiefly of one of natural rubber, isoprene rubber, butadiene rubber, styrene rubber, butyl rubber, ethylene-propylene rubber, chloroprene rubber, chlorosulfonated polyethylene, epichlorohydrin rubber, nitrile rubber, acrylic rubber, urethane rubber, polysulfide polymer, silicone rubber, and fluorocarbon rubber.

6. A display device comprising:
a first substrate;
a second substrate disposed to face said first substrate;
a plurality of pixels made of an organic light-emitting material and disposed in a display area on an inner surface of said first substrate;

a rubber member disposed between said first and second substrates, and having a first part surrounding said display area and a second part superposed on at least a portion of an area on an inner surface of said second substrate, said area directly facing said display area of said first substrate; and an adhesive layer sealing together said first and second substrates along peripheries thereof; wherein said rubber member seals said display area from an ambient atmosphere, and said adhesive layer is derived from a sol-gel solution.

7. A display device according to claim 6, wherein said rubber member is made chiefly of one of natural rubber, isoprene rubber, butadiene rubber, styrene rubber, butyl rubber, ethylene-propylene rubber, chloroprene rubber, chlorosulfonated polyethylene, epichlorohydrin rubber, nitrile rubber, acrylic rubber, urethane rubber, polysulfide polymer, silicone rubber, and fluorocarbon rubber.

8. A display device according to claim 6, wherein said sol-gel solution contains one of ethoxy silane, and alkoxides of Si, Zr, Ti and Sn.

9. A display device comprising:

a first substrate;

a second substrate disposed to face said first substrate;

a plurality of pixels made of an organic light-emitting material and disposed in a display area on an inner surface of said first substrate;

a rubber member disposed between said first and second substrates, and having a first part surrounding said display area and a second part superposed on at least a portion of an area on an inner surface of said second substrate, said area directly facing said display area of said first substrate; and an adhesive layer sealing together said first and second substrates along peripheries thereof;

wherein said rubber member seals said display area from an ambient atmosphere, and said adhesive layer is made of one of a photocurable adhesive and a thermosetting adhesive.

10. A display device according to claim 9, wherein said rubber member is made chiefly of one of natural rubber, isoprene rubber, butadiene rubber, styrene rubber, butyl rubber, ethylene-propylene rubber, chloroprene rubber, chlorosulfonated polyethylene, epichlorohydrin rubber, nitrile rubber, acrylic rubber, urethane rubber, polysulfide polymer, silicone rubber, and fluorocarbon rubber.

11. A display device comprising:

a first substrate;

a second substrate disposed to face said first substrate;

a plurality of pixels made of an organic light-emitting material and disposed in a display area on an inner surface of said first substrate;

a rubber member disposed between said first and second substrates to surround said display area, and sealing said display area from an ambient atmosphere; and an adhesive layer sealing together said first and second substrates along peripheries thereof;

wherein said adhesive layer is derived from a sol-gel solution, and a width of said adhesive layer is in a range of from $1\times10^{-3}$ to $1\times10^{4}$ times a thickness of said adhesive layer.

12. A display device according to claim 11, wherein said rubber member is made chiefly of one of natural rubber, isoprene rubber, butadiene rubber, styrene rubber, butyl rubber, ethylene-propylene rubber, chloroprene rubber, chlorosulfonated polyethylene, epichlorohydrin rubber, nitrile rubber, acrylic rubber, urethane rubber, polysulfide polymer, silicone rubber, and fluorocarbon rubber.

13. A display device according to claim 11, wherein said sol-gel solution contains one of ethoxy silane, and alkoxides of Si, Zr, Ti and Sn.

14. A display device according to claim 1, wherein said rubber member contains at least one of a dehumidifying agent and a free-oxygen absorber.

15. A display device according to claim 1, wherein said rubber member contains a light-blocking material.

16. A display device according to claim 1, wherein said rubber member contains a conductive filler.

17. A display device comprising:

a first substrate;

a second substrate disposed to face said first substrate;

a plurality of pixels made of an organic light-emitting material and disposed in a display area on an inner surface of said first substrate; and an adhesive layer sealing together said first and second substrates along peripheries thereof from an ambient atmosphere;

wherein said adhesive layer is derived from a sol-gel solution, and a width of said adhesive layer is in a range of from $1\times10^{3}$ to $1\times10^{4}$ times a thickness of said adhesive layer.

18. A display device according to claim 17, wherein said sol-gel solution contains one of ethoxy silane, and alkoxides of Si, Zr, Ti and Sn.

19. A display device according to claim 1, wherein said second substrate has, at a portion thereof in contact with said adhesive layer, a protruding portion which surrounds said display area and protrudes toward said first substrate.

* * * * *